United States Patent
Cartiglia et al.

(10) Patent No.: US 10,811,555 B2
(45) Date of Patent: Oct. 20, 2020

(54) PARTICLE DETECTOR CAPABLE OF SEPARATING IN-TIME SIGNALS FROM OUT-OF-TIME SIGNALS

(71) Applicant: ISTITUTO NAZIONALE DI FISICA NUCLEARE, Frascati (IT)

(72) Inventors: Nicolò Cartiglia, Milan (IT); Gian Franco Dalla Betta, Montebelluna (IT); Lucio Pancheri, Trento (IT); Maurizio Boscardin, Rovereto (IT); Giovanni Paternoster, Cognola (IT)

(73) Assignee: Istituto Nazionale di Fisica Nucleare, Fascati (IT)

( * ) Notice: Subject to any disclaimer, the term of this patent is extended or adjusted under 35 U.S.C. 154(b) by 39 days.

(21) Appl. No.: 16/331,241

(22) PCT Filed: Sep. 12, 2017

(86) PCT No.: PCT/IB2017/055480
§ 371 (c)(1),
(2) Date: Mar. 7, 2019

(87) PCT Pub. No.: WO2018/051226
PCT Pub. Date: Mar. 22, 2018

(65) Prior Publication Data
US 2019/0198704 A1 Jun. 27, 2019

(30) Foreign Application Priority Data
Sep. 14, 2016 (IT) .................. 102016000092430

(51) Int. Cl.
*H01L 31/115* (2006.01)
*H01L 31/118* (2006.01)
(Continued)

(52) U.S. Cl.
CPC .......... *H01L 31/118* (2013.01); *H01L 31/028* (2013.01); *H01L 31/022408* (2013.01); *H01L 31/115* (2013.01)

(58) Field of Classification Search
CPC ....................................................... H01L 31/115
See application file for complete search history.

(56) References Cited

PUBLICATIONS

Pellegrini, G. "Technology developments and first measurements of Low Gain Avalanche Detectors (LGAD) for high energy physics applications" Nuc. Int. and Meth. Phys. Res. Sec. A vol. 765 Nov. 2014 pp. 12-16 (Year: 2014).*

(Continued)

*Primary Examiner* — Grant S Withers
(74) *Attorney, Agent, or Firm* — Thomas|Horstemeyer LLP

(57) ABSTRACT

Silicon Particle Detector, comprising an absorption region (10) capable of generating electrical charges in response to a particle passing therethrough, a first and a second electrode (20, 30) arranged on opposite sides of the absorption region (10), wherein the first electrode (20) is segmented into a plurality of pads (20a), and a plurality of multiplication layers (40) able to avalanche-multiply the electric charges generated in the absorption region (10), each of the multiplication layers (40) being arranged beneath a respective pad (20a) and interposed between it and the absorption region (10), each multiplication layer (40) is surrounded by a respective protection ring (50) formed by the material of the pad (20a). The protection ring (50) is laterally interposed between the multiplication layer (40) and the absorption region (10).

4 Claims, 2 Drawing Sheets

(51) Int. Cl.
    H01L 31/0224    (2006.01)
    H01L 31/028     (2006.01)

(56) References Cited

PUBLICATIONS

Fernandez-Martinez, P. "Low Gain Avalanche Detectors for high energy Physics" 2015 Span. Conf. on Elec. Dev (CDE) Apr. 20, 2015 pp. 1-4 (Year: 2015).*

Ugobono, S. "Multiplication onset and electric field properties of proton irradiated LGADs" 26th Int. Work. on Vertex Det. Nov. 2018 pp. 1-13 (Year: 2018).*

Gallrapp, C. "Study of gain homogeneity and radiation effects of Low Gain Avalanche Pad Detectors" Nucl. Ins. and Meth. in Phys. Res. Sec. A vol. 875, Dec. 11, 2017 pp. 27-34 (Year: 2017).*

Ely, S. Low-gain Avalanche Detectors "LGAD" Poster for presentation available online at https://rd50.web.cern.ch/doc/talks/2014-11-IEEE-2014-LGAD-poster-4%203-sm.pdf as of Jun. 8, 2020 stated date is Nov. 2014 pp. 1 (Year: 2014).*

Rochas, A. "First Fully Integrated 2-D Array of Single-Photon Detectors in Standard CMOS Technology" IEEE Photonics Technology Letters v. 15(7), Jul. 2003 pp. 963-965 (Year: 2003).*

International Search Report for PCT/IB2017/055480 filed Sep. 12, 2017.

Fernandez-Martinez P et al: "Low Gain Avalanche detectors for high energy physics", 2015 10th, Spanish Conference on Electron Devices (COE), IEEE, Feb. 11, 2015 (Feb. 11, 2015), pp. 1-4.

G. Pellegrini et al: "Technology developments and first measurements of Low Gain Avalanche Detectors (LGAD) for high energy physics applications", Nuclear Instruments and Methods in Physics Research Section A: Accelerators, Spectrometers, Detectors and Associated Equipment, vol. 765, Jun. 28, 2014 (Jun. 28, 2014), pp. 12-16.

G. F. Dalla Betta et al, "Design and TCAD simulation of double-sided pixelated low gain amplification detectors", Nuclear Instruments and Methods in Physics Research A 796 (2015) 154-157.

P. Fernandez-Martinez et al, "Design and Fabrication of an Optimal Peripheral Region for the LGAD", Nuclear Instruments and Methods in Physics Research A 821 (2016) 93-100.

* cited by examiner

PARTICLE DETECTOR CAPABLE OF SEPARATING IN-TIME SIGNALS FROM OUT-OF-TIME SIGNALS

CROSS-REFERENCE TO RELATED APPLICATIONS

This application is the 35 U.S.C. § 371 national stage application of PCT Application No. PCT/IB2017/055480, filed Sep. 12, 2017, where the PCT claims the priority to and benefit of Italian Patent Application No. 102016000092430, filed Sep. 14, 2016, both of which are herein incorporated by reference in their entireties.

The present invention generally relates to particle detectors, and in particular to ultra-fast silicon detectors UFSD.

Detectors of this type are described for example in the publications "Design and TCAD simulation of double-sided pixelated low gain amplification detectors" [1] and "Design and Fabrication of an Optimal Peripheral Region for the LGAD" [2].

One of the problems with UFSD silicon detectors is that of being able to recognize the particles that generate out-of-time signals with respect to when they pass, where "out-of-time" means a time delay greater than a few picoseconds.

Such phenomenon is illustrated in FIGS. 1 and 2, which represent a known detector. In such figures, 1 indicates an absorption region capable of generating electrical charges in response to a particle passing therethrough, whereas a first and second electrode arranged on opposite sides of the absorption region 1 are indicated at 2 and 3 respectively. One of such electrodes is an anode while the other electrode is a cathode. The first electrode 2 is formed by a plurality of pads 2a arranged in an array. The segmentation of the first electrode 2 in a plurality of pads 2a serves to ensure a good spatial localization of the passage of the particle. As can be seen, neighboring pads are separated from each other by a gap 1a formed of material from the absorption region 1.

Below each pad 2a, and interposed between it and the absorption region 1, there is arranged a respective multiplication layer 4, capable of avalanche-multiplying the electric charges generated in the absorption layer 1.

In FIG. 1, a vertical arrow represents the trajectory of an incident particle that crosses the detector at one of the pads 2a. In this case, the charges produced by the particle in the absorption region 1 immediately reach the multiplication layer 4, generating an amplified signal within a few picoseconds from the passing of the particle.

In FIG. 2, a vertical arrow represents the trajectory of an incident particle that crosses the detector at the gap 1a between two adjacent pads 2a. In this case, the charges produced by the particle take a longer time to reach the multiplication layer 4 compared to the previous case. The amplified signal arrives therefore delayed with respect to when the particle passed, a delay that has been estimated at 100-200 ps. Since it is not possible to recognize that the particle has struck between two pads, the measurement of the passage of time for the particle is incorrect for this time, 100-200 ps.

To solve this problem, it has been proposed to place the gain layer not under the pads, but on the other side of the silicon detector, the ohmic side, so as to have the segmentation on the one hand and the signal multiplication on the other [1]. Such solution has not, however, proved fully satisfactory due the difficulty of manufacturing this geometry in thin sensors. "Thin sensors" means those sensors having a thickness such that they are not self-supporting and flex due to their own weight (thicknesses less than 100 microns).

In light of the foregoing, the present invention aims to provide an alternative solution for solving the problem of the delayed signal produced by particles passing through the spaces between the pads.

To confront this problem, the object of the invention is a silicon particle detector, comprising
an absorption region capable of creating electric charges as a response to a particle passing therethrough,
a first and a second electrode on opposite sides of the absorption region, one of said first and second electrode being an anode and the other of said first and second electrode being a cathode, wherein the first electrode is formed by a plurality of pads arranged in array, neighboring pads being separated from each other by a gap formed of material of the absorption region, and
a plurality of multiplication layers capable of avalanche-multiplying the electric charges generated in the absorption layer, each of the multiplication layers being arranged beneath a respective pad, and interposed between it and the absorption region, wherein each multiplication layer is surrounded by a respective protection ring formed of the pad material, the protective ring being laterally interposed between the multiplication layer and the absorption region.

According to this idea of solution, there is therefore provided a protection ring consisting of an extension of the pad in depth, which surrounds the multiplication layer. In this case, the particles that strike between two pads are unable to reach the multiplication layer, and thus produce small signals, the contribution of which to the overall signal provided by the detector being therefore negligible.

This protection ring is obtained by means of a further implantation of material equal to that of the pad, but in a manner to obtain a deeper implantation than that of the pad (for example, using a higher implantation energy than the one used for the pad). The total depth of the implantation of the protection ring is estimated to be 1-2 microns, while the pad has a thickness of about 0.5 micron.

Preferred forms of the invention are defined in the dependent claims, which are intended as an integral part of the present description.

Further features and advantages of the detector according to the invention will become more apparent in the following detailed description of an embodiment of the invention, made with reference to the appended drawings, provided purely to be illustrative and non-limiting, wherein FIGS. 1 and 2 is a structural diagram of a known particle detector;

Figure 3:
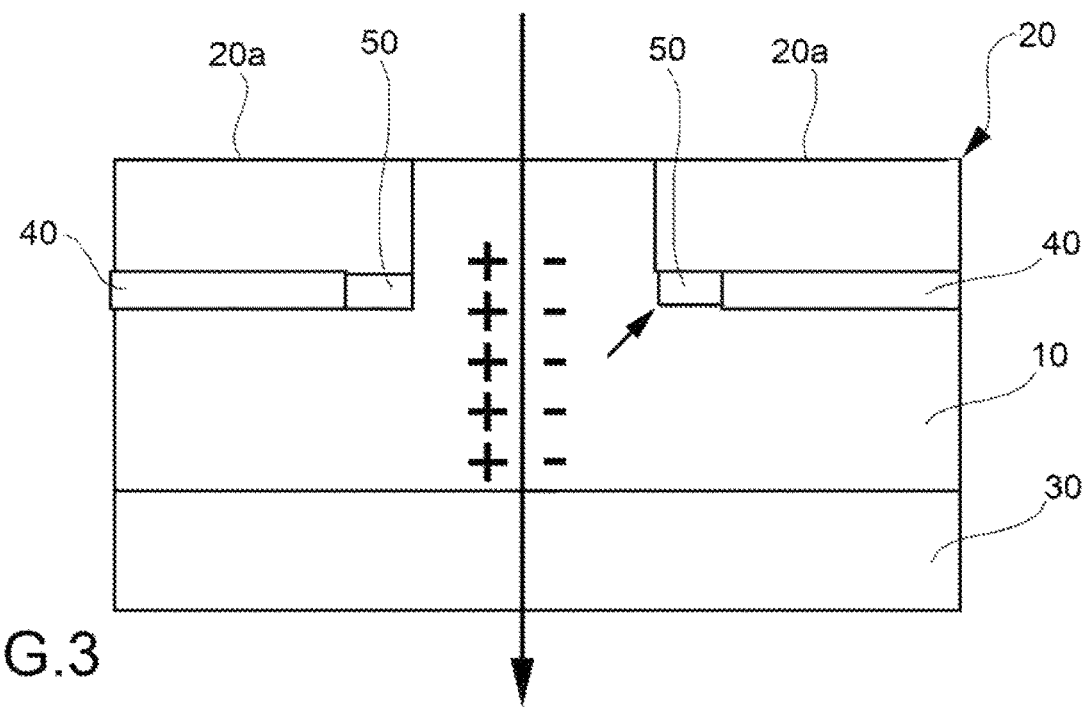
FIG. 3 is a structural diagram of a detector according to the invention.
Figure 4:
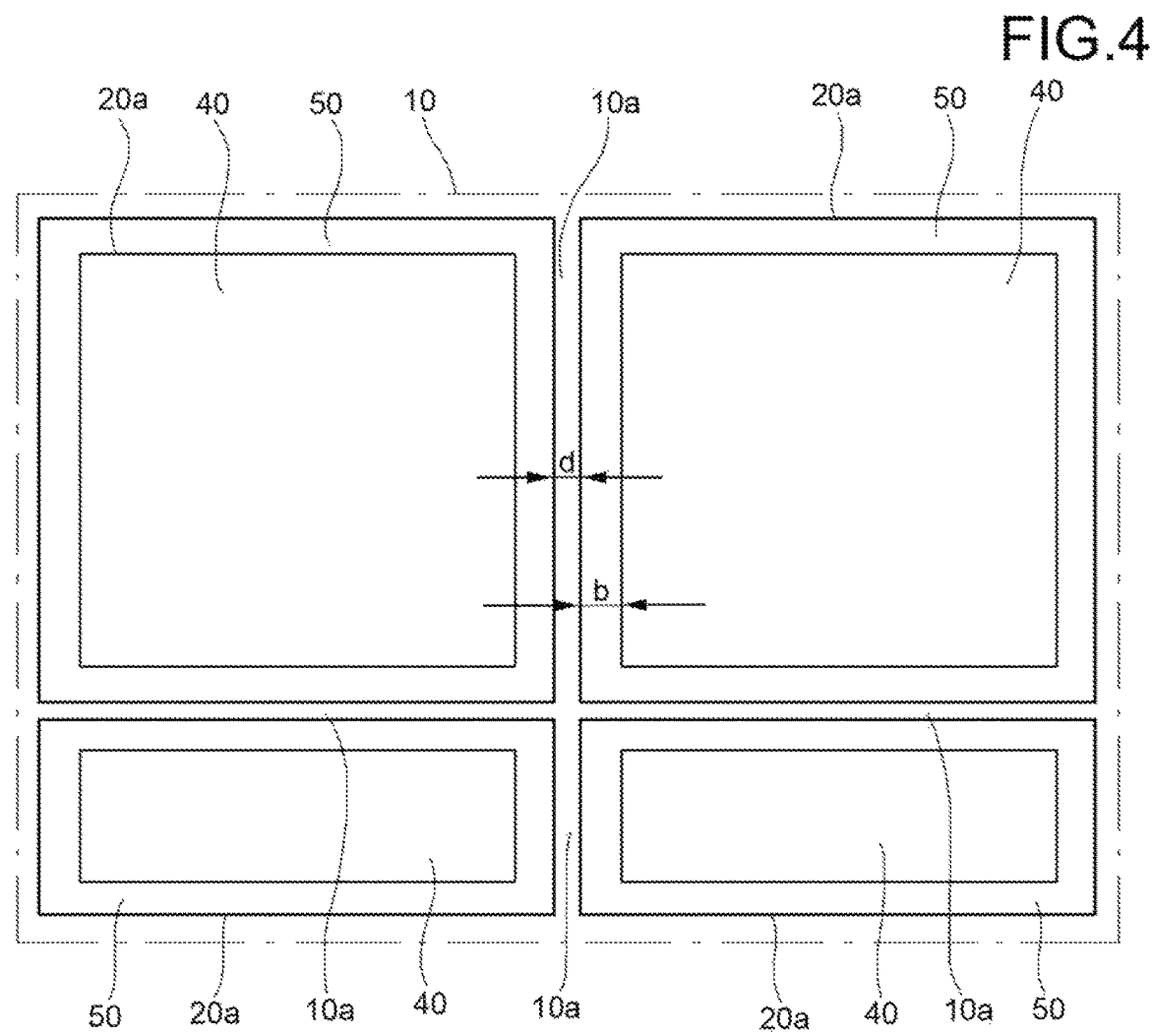
FIG. 4 is a plan view of a part of the detector of FIG. 3.

With reference to FIGS. 3 and 4, a silicon particle detector is shown, in particular, an ultra-fast silicon detector UFSD.

The detector comprises an absorption region 10 capable of generating electrical charges in response to a particle passing therethrough, and a first and second electrode 20, 30 arranged on opposite sides of the absorption region 10. Depending on the possible configurations of the detector, one of such electrodes 20, 30 is an anode while the other is a cathode.

The first electrode 20 is segmented into a plurality of pads 20a arranged in an array. Each pad, generally square or rectangular, has lateral dimensions that may vary from tens of microns to several millimeters.

As used in this description, the term "lateral" means any direction in a plane orthogonal to the direction that goes from the anode to the cathode.

Figure 1:
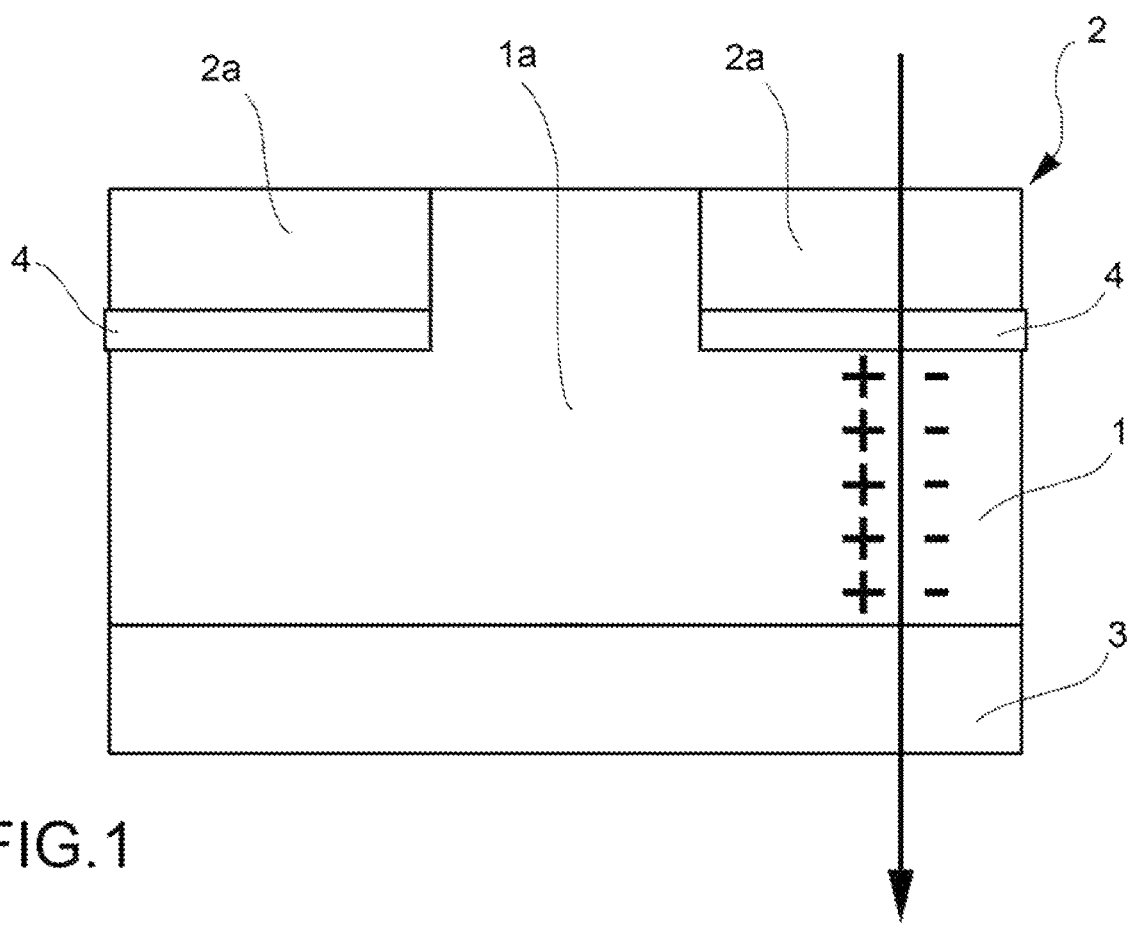
Figure 2:
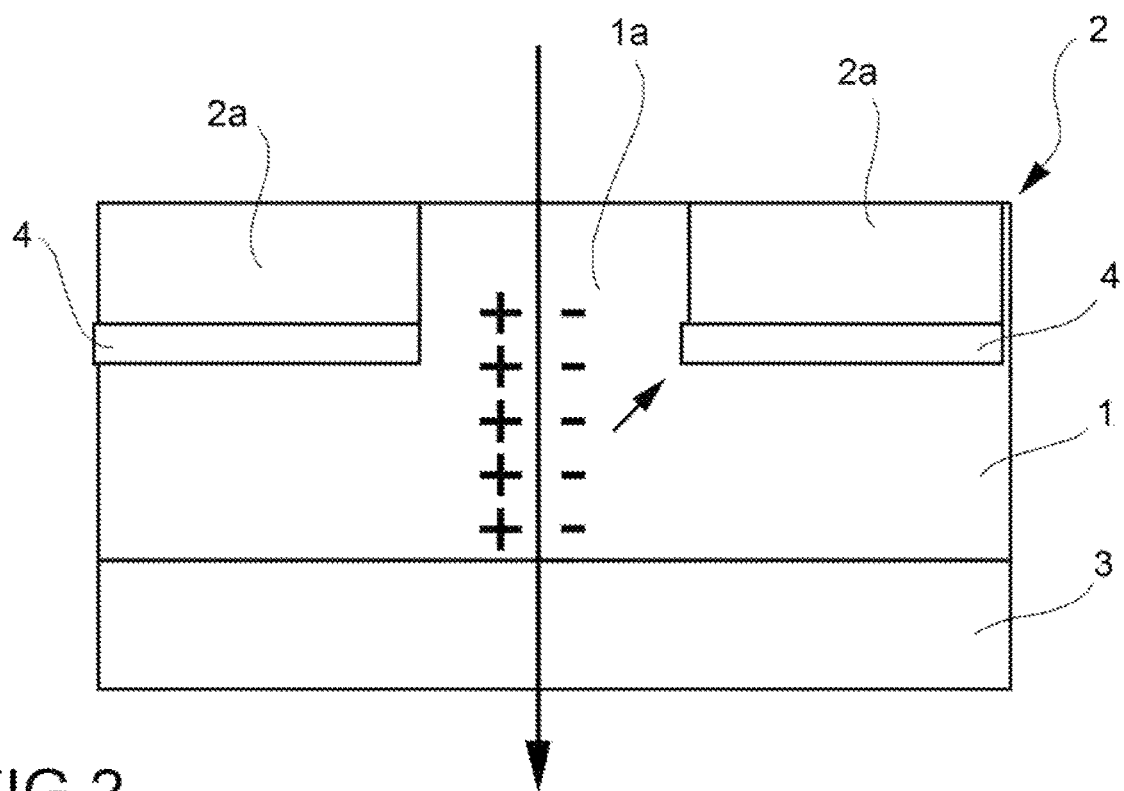

The neighboring pads 20a are separated from each other by a gap 10a formed by material from the absorption region 10. The distance d between two pads, i.e. the width of the gap, is normally kept as small as possible, with typical distances of 50-100 μm. In FIGS. 1 to 3, such distance is exaggerated for clarity of representation.

Below each pad 20a, and interposed between it and the absorption region 10, there is arranged a respective multiplication layer 40, capable of avalanche-multiplying the electric charges generated in the absorption layer 10.

Each multiplication layer 40 has lateral dimensions smaller than those of the overlying respective pad 20a and is surrounded by a respective protection ring 50 formed of the material of the pad 20a. The protection ring 50 is therefore laterally interposed between the multiplication layer 40 and the absorption region 10. The width b of the ring is about 10-30 μm.

The thickness of the various layers is generally on the order of microns or tens of microns.

The absorption region 10, the first and second electrodes 20, 30, the multiplication layers 40 and the protection rings 50 are made of the same semiconductor material, in particular, silicon.

The first electrode 20 and the protection rings 50 have a first type of doping, for example n, and the multiplication layers 40, the absorption region 10 and the second electrode 30 have a second type of doping opposite to the first, for example p.

The first and second electrodes 20, 30 and the protection rings 50 have a concentration of charge carriers greater than that of the multiplication layers 40. The multiplication layers 40 exhibit a concentration of charge carriers greater than that of the absorption region 10.

For the purposes of this description, the term "concentration of charge carriers" means the concentration of the majority carriers in each individual detector region.

For example, the concentration of charge carriers at room temperature in the first and second electrodes 20, 30 and in the protection rings 50 may be on the order of $10^{18}$ cm$^{-3}$. The concentration of charge carriers at room temperature in the multiplication layers 40 may be on the order of $10^{16}$ cm$^{-3}$. The concentration of charge carriers at room temperature in the absorption region 10 may be on the order of $10^{12}$ cm$^{-3}$.

The symbols n++ and p++ are therefore used to refer to doping levels (charge carrier concentration) of the silicon of approximately $10^{18}$ cm$^{-3}$ for silicon of type n and of type p, respectively.

On the other hand, symbols n+ and p+ are used to refer to silicon doping levels of about $10^{16}$ cm$^{-3}$ per silicon of type n and of type p, respectively.

Finally, the symbols n− and p− are used to refer to silicon doping levels of about $10^{12}$-$10^{14}$ cm$^{-3}$ per silicon of type n and of type p, respectively.

For example, a detector may be provided wherein the absorption region 10 is of doped silicon p−, the first electrode 20 (or more specifically, the individual pads 20a) of doped silicon n++, the second electrode 30 of doped silicon p++, the multiplication layer 40 of doped silicon p+ so as to create a contact n+/p+ between the overlying pad and the multiplication layer, and the silicon protection ring 50 doped in the same manner as the pad, i.e. n++.

The structure that is generated in this detector is therefore of the type n++/p+/p−/p++ in the central region of each pad, while it is of the type n++/p−/p++ in the peripheral region of each pad, where the ring is positioned.

Naturally, it is possible to provide a detector having an inverted doping type with respect to the one indicated above, i.e. of the type p++/n+/n−/n++, in the central region of each pad, and of the type p++/n−/n++ in the peripheral region of each pad, where the ring is located.

For the operation of the detector described above, a potential difference between the first and second electrode is applied. For example, a negative voltage is applied to the second electrode 30 with respect to the first electrode 20, if the first electrode is doped n++ and the second p++.

The electrical field generated in the detector causes the movement of free charges created by radiation: if the free charges are created directly under the multiplication layer 40, then they are collected by passing through the multiplication layer 40 and their signal is multiplied. If, however, as shown in FIG. 3, the free charges are created in a region between two neighboring pads, they are collected by the protection ring 50 without being multiplied.

The use of the protection ring 50 therefore allows multiplying only the radiation hitting the part of the absorption region 10 which lies between the absorption layer 40 and the second electrode 30, leaving the signal of the particle which hit elsewhere unaltered and thus easily recognizable.

It is interesting to point out a second effect due to the addition of the protection ring around each pad in a segmented detector: with this design, the segmented detector becomes more resistant to the effects of electric breakdowns as the edge terminations of each pad are deeper and therefore, in the vicinity thereof, the electric field is smaller.

BIBLIOGRAPHICAL REFERENCES

[1] G. F. Dalla Betta et al, "Design and TCAD simulation of double-sided pixelated low gain amplification detectors", https://indico.cern.ch/event/313925/contributions/1687301/attachments/601603/827991/G F_DALLA_BETTA.pdf

[2] P. Fernández-Martinez et al, "Design and Fabrication of an Optimal Peripheral Region for the LGAD", https://indico.cern.ch/event/313925/contributions/1687306/attachments/601607/827995/6_4_FernandezMartinez_LGAD_Design.pdf.

The invention claimed is:

1. A silicon particle detector comprising:
an absorption region capable of creating electric charges as a response to a particle passing therethrough,
a first and a second electrode on opposite sides of the absorption region, one of said first and second electrode being an anode and the other of said first and second electrode being a cathode, wherein the first electrode is formed by a plurality of pads arranged in array, neighboring pads being separated from each other by a gap formed by material of the absorption region, and
a plurality of multiplication layers capable of avalanche-multiplying the electric charges created in the absorption region, each multiplication layer of the plurality of multiplication layers being arranged under a respective pad of the plurality of pads and interposed between the respective pad of the plurality of pads and the absorption region,
wherein each multiplication layer of the plurality of multiplication layers is surrounded by a respective protection ring formed of the same type material as the respective pad, the respective protection ring being laterally interposed internally between the plurality of multiplication layers and the absorption region.

2. The detector according to claim 1, wherein the respective protection rings that surrounds each multiplication layer of the plurality of multiplication layers forms a plurality of protection rings, wherein the absorption region, the first and second electrode, the plurality of multiplication layers and the plurality of protection rings are made of silicon, the first electrode and plurality of protection rings having a first type of doping, and the plurality of multiplication layers, absorption region and second electrode have a second type of doping, opposite to the first type of doping.

3. The detector according to claim 2, wherein the first and second electrode and plurality of protection rings have a higher doping concentration than the plurality of multiplication layers, the plurality of multiplication layers having a higher doping concentration than the absorption region.

4. The detector according to claim 3, wherein a doping concentration in the first and second electrode and plurality of protection rings is of the order of magnitude of $10^{18}$ cm$^{-3}$, a doping concentration in the plurality of multiplication layers is of the order of magnitude of $10^{16}$ cm$^{-3}$, and a doping concentration in the absorption region is of the order of magnitude of $10^{12}$-$10^{14}$ cm$^{-3}$.

\* \* \* \* \*